United States Patent
Muraki et al.

(10) Patent No.: US 9,455,124 B2
(45) Date of Patent: Sep. 27, 2016

(54) DRAWING APPARATUS, AND METHOD OF MANUFACTURING ARTICLE

(71) Applicant: CANON KABUSHIKI KAISHA, Tokyo (JP)

(72) Inventors: Masato Muraki, Inagi (JP); Yoshihiro Hirata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/260,052

(22) Filed: Apr. 23, 2014

(65) Prior Publication Data

US 2014/0322653 A1    Oct. 30, 2014

(30) Foreign Application Priority Data

Apr. 30, 2013 (JP) ................................. 2013-095960

(51) Int. Cl.
H01J 37/30 (2006.01)
H01J 37/317 (2006.01)
H01J 37/302 (2006.01)

(52) U.S. Cl.
CPC ........ *H01J 37/3177* (2013.01); *H01J 37/3026* (2013.01); *H01J 2237/31766* (2013.01)

(58) Field of Classification Search
CPC ................... H01J 37/3177; H01J 2237/31766
See application file for complete search history.

(56) References Cited

U.S. PATENT DOCUMENTS

| | | |
|---|---|---|
| 2004/0114143 A1 | 6/2004 | Van Haren et al. |
| 2009/0242787 A1 | 10/2009 | Nakayamada et al. |
| 2011/0182161 A1* | 7/2011 | Suzuki ................... B82Y 10/00 369/47.13 |
| 2013/0032729 A1 | 2/2013 | Knippelmeyer |
| 2013/0056647 A1* | 3/2013 | Yoshikawa et al. .......... 250/400 |
| 2014/0362356 A1 | 12/2014 | Shibazaki |

FOREIGN PATENT DOCUMENTS

| | | |
|---|---|---|
| CN | 103069536 A | 4/2013 |
| JP | 62-144323 A | 6/1987 |
| TW | I277842 B | 4/2007 |
| TW | 200942980 A | 10/2009 |

OTHER PUBLICATIONS

Taiwan IPO Search Report issued in corresponding Taiwan Invention Patent Application No. 103113857, dated Dec. 19, 2014. English translation provided.

* cited by examiner

*Primary Examiner* — Robert Kim
*Assistant Examiner* — Eliza Osenbaugh-Stewar
(74) *Attorney, Agent, or Firm* — Rossi, Kimms & McDowell LLP

(57) ABSTRACT

The present invention provides a drawing apparatus for performing drawing on a substrate with a charged particle beam, including a stage configured to hold the substrate and be moved, a charged particle optical system configured to irradiate a plurality of charged particle beams arrayed along a first axis, and a controller configured to control the drawing so as to perform multiple irradiation of a target portion on the substrate with the plurality of charged particle beams, wherein the controller configured to control the drawing such that the stage is moved in one direction along the first axis with respect to a plurality of regions formed on the substrate along the first axis, and a deflection of charged particle beam for a displacement of charged particle beam along the first axis is performed with respect to drawing on each of the plurality of regions.

7 Claims, 5 Drawing Sheets

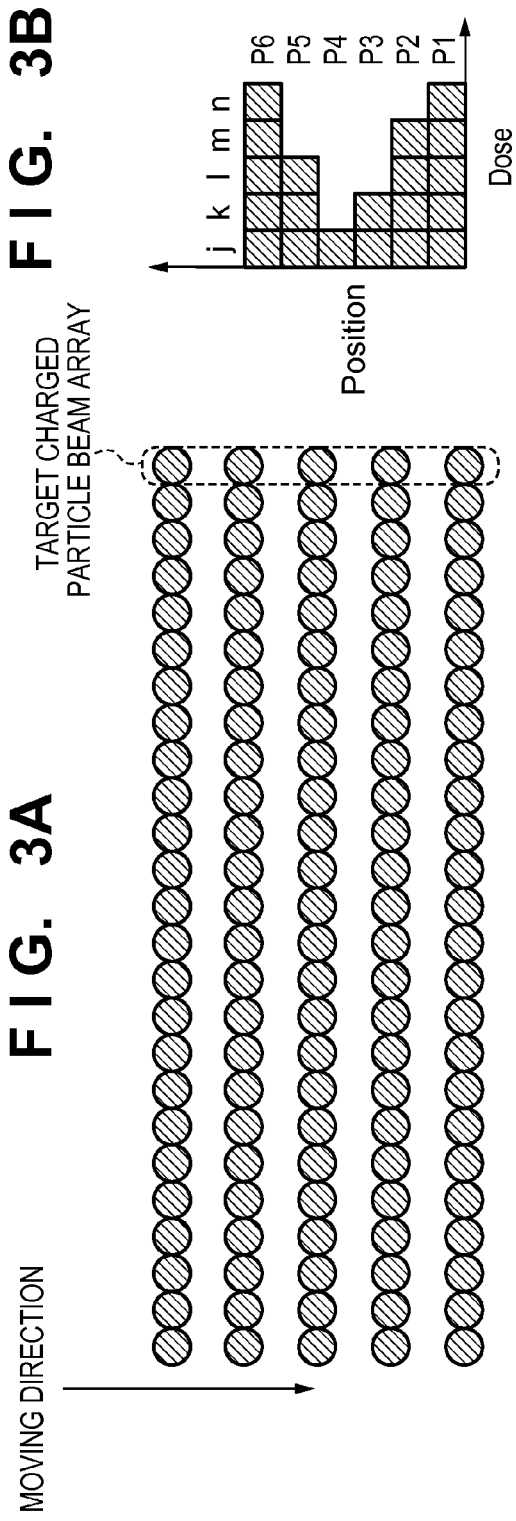
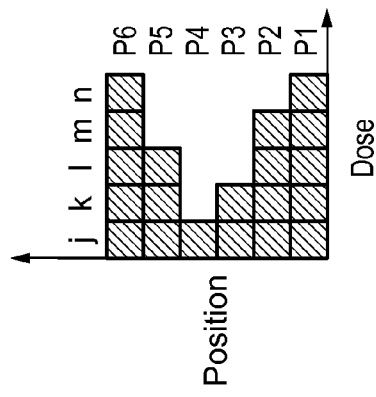
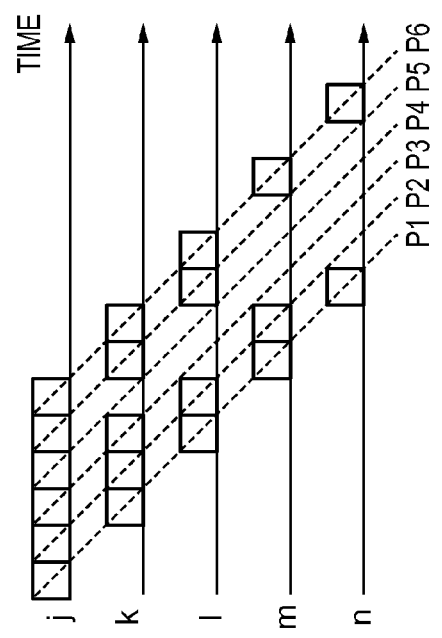
FIG. 3A
FIG. 3B
FIG. 3C

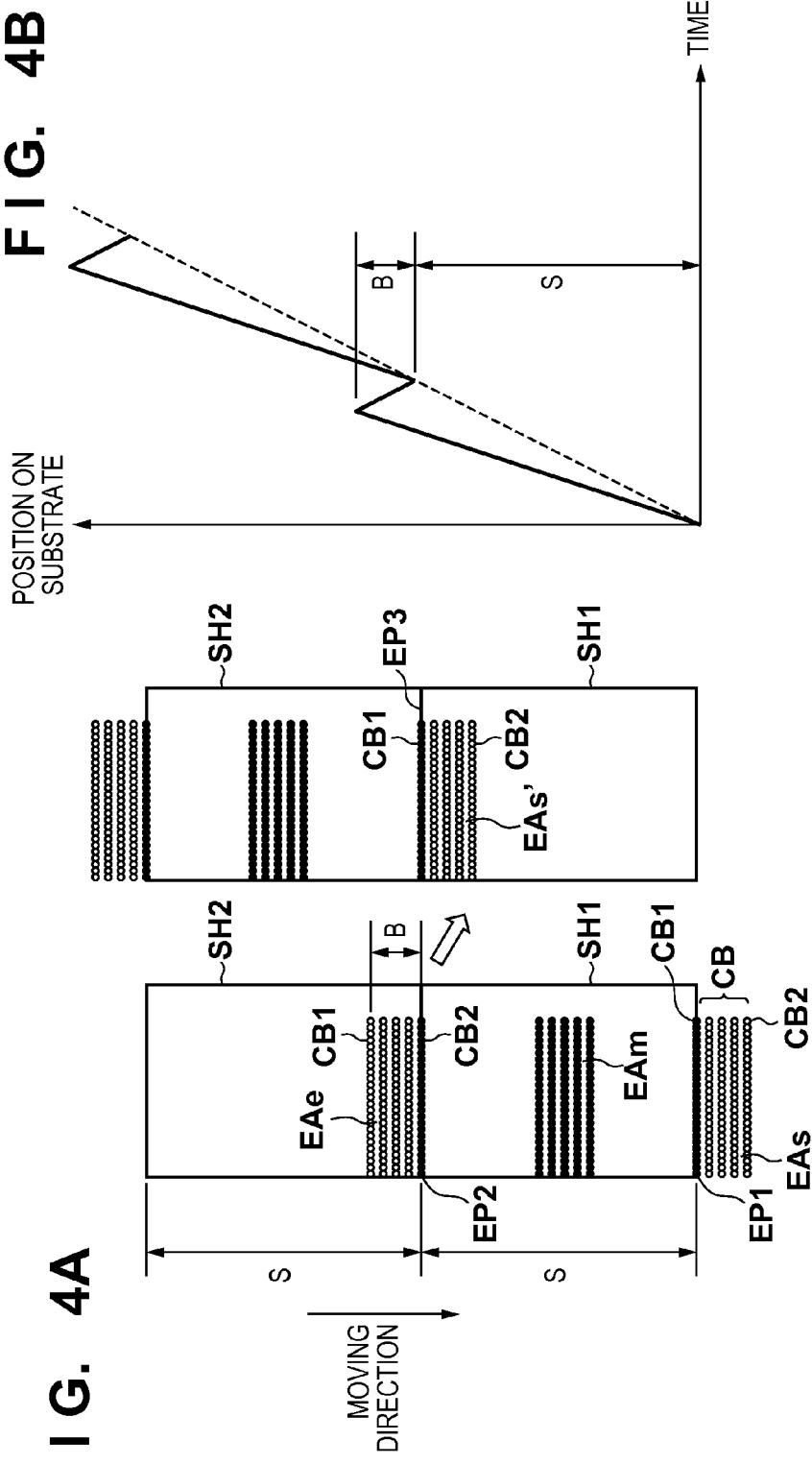

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

A drawing apparatus using a charged particle beam such as an electron beam performs overlay drawing that draws a new pattern overlaid on a pattern (to be referred to as a "shot pattern" hereinafter) formed in each shot region of a substrate (see Japanese Patent Laid-Open No. S62-144323).

In the overlay drawing, first, a substrate is moved based on the designed array coordinate values of a plurality of shot patterns, and positions when some of the plurality of shot patterns are aligned to a reference position are actually measured. Next, assuming the designed array coordinate values of shot patterns and actual array coordinate values to align have a unique relation including a predetermined error, error parameters are decided such that the average deviation between the plurality of measured values and the actual array coordinate values to align is minimized. The actual array coordinate values of the shot patterns are obtained based on the error parameters and the designed array coordinate values of the shot patterns. The substrate is positioned in accordance with the actual array coordinate values, and a new pattern is drawn.

In such overlay drawing, distortions (for example, expansion/contraction and rotation) of shot patterns are also measured as well as the actual array coordinate values of the shot patterns. The distortions of shot patterns occur due to factors of a lithography apparatus such as a drawing apparatus when forming a pattern or due to deformation of a substrate caused by a heat process when forming a pattern.

FIG. 5A is a view showing the array of 5 (rows)×5 (columns) shot patterns formed on a substrate SB. Actual shot patterns SP are indicated by solid lines, and designed shot patterns SP' are indicated by broken lines. FIG. 5B shows a state in which overlay drawing is performed for the substrate SB (actual shot patterns SP) by a drawing apparatus including a plurality of charged particle optical systems CP1, CP2, and CP3. Referring to FIG. 5B, each of the charged particle optical systems CP1 to CP3 emits 5 (rows)×5 (columns) charged particle beams to the substrate SB. When a stage that holds the substrate SB is moved to the upper side with respect to the charged particle optical systems CP1, CP2, and CP3, the charged particle optical systems CP1, CP2, and CP3 draw stripe regions S1, S2, and S3, respectively (stripe drawing). In this stripe drawing, multiple irradiation is performed for the same positions of the substrate by the charged particle beams of the charged particle optical systems which are arrayed in the substrate moving direction. The irradiation is on/off-controlled, thereby controlling the irradiating doses of the charged particle beams on the substrate.

Each charged particle optical system includes a deflector configured to deflect charged particle beams. This deflector adjusts the positions of (drawing regions defined by) a plurality of charged particle beams on the substrate at once. In the stripe drawing, a new pattern is overlaid and drawn on the shot patterns while adjusting the positions of the drawing regions of the charged particle optical systems by the deflectors based on the actual positions of the shot patterns on the substrate.

In overlay drawing, however, when the drawing region of a charged particle optical system extends over shot patterns adjacent in the substrate moving direction (that is, located on both of two adjacent shot patterns), the following problem arises. In fact, the shot patterns on the substrate are not always periodically arrayed along the designed array coordinates (that is, the positions of the shot patterns are shifted). It is therefore necessary to perform drawing while adjusting (correcting) the position of the drawing region with respect to the shot patterns. However, when the drawing region of a charged particle optical system extends over shot patterns adjacent in the substrate moving direction, the position of the drawing region of the charged particle optical system can be corrected with respect to only one of the shot patterns. Hence, before drawing for a preceding shot pattern is completed, drawing for the next shot pattern cannot be performed. For this reason, after drawing for a preceding shot pattern is completed, the substrate needs to be moved in an opposite direction by a distance corresponding to the charged particle beams arrayed in the substrate moving direction (a length along the substrate moving direction in the drawing region) to perform drawing for the next shot pattern. As a result, since the stage that holds the substrate is discontinuously moved (that is, the stage cannot continuously be moved in one direction), stage movement takes time, and the throughput lowers. In addition, since stage movement is complex, the reproducibility of stage position control lowers, and the precision of relative alignment between the charged particle beams and the substrate also lowers.

SUMMARY OF THE INVENTION

The present invention provides, for example, a drawing apparatus advantageous in terms of overlay precision and throughput in performing drawing on a substrate with a plurality of charged particle beams.

According to one aspect of the present invention, there is provided a drawing apparatus for performing drawing on a substrate with a charged particle beam, including a stage configured to hold the substrate and be moved, a charged particle optical system having a function of irradiating a plurality of charged particle beams arrayed along a first axis and of blanking at least a portion of the plurality of charged particle beams, and a function of deflection of the plurality of charged particle beams to perform displacement of the plurality of charged particle beams on the substrate, and a controller configured to control the drawing so as to perform multiple irradiation of a target portion on the substrate with the plurality of charged particle beams, wherein the controller is configured to control the drawing such that the stage is moved in one direction along the first axis with respect to a plurality of regions formed on the substrate along the first axis, and the deflection for the displacement along the first axis is performed with respect to drawing on each of the plurality of regions.

Further aspects of the present invention will become apparent from the following description of exemplary embodiments with reference to the attached drawings.

BRIEF DESCRIPTION OF THE DRAWINGS

FIGS. 3A to 3C are views for explaining drawing processing of the drawing apparatus shown in FIG. 1.

FIGS. 4A to 4C are views for explaining drawing processing of the drawing apparatus shown in FIG. 1.

DESCRIPTION OF THE EMBODIMENTS

Figure 1:
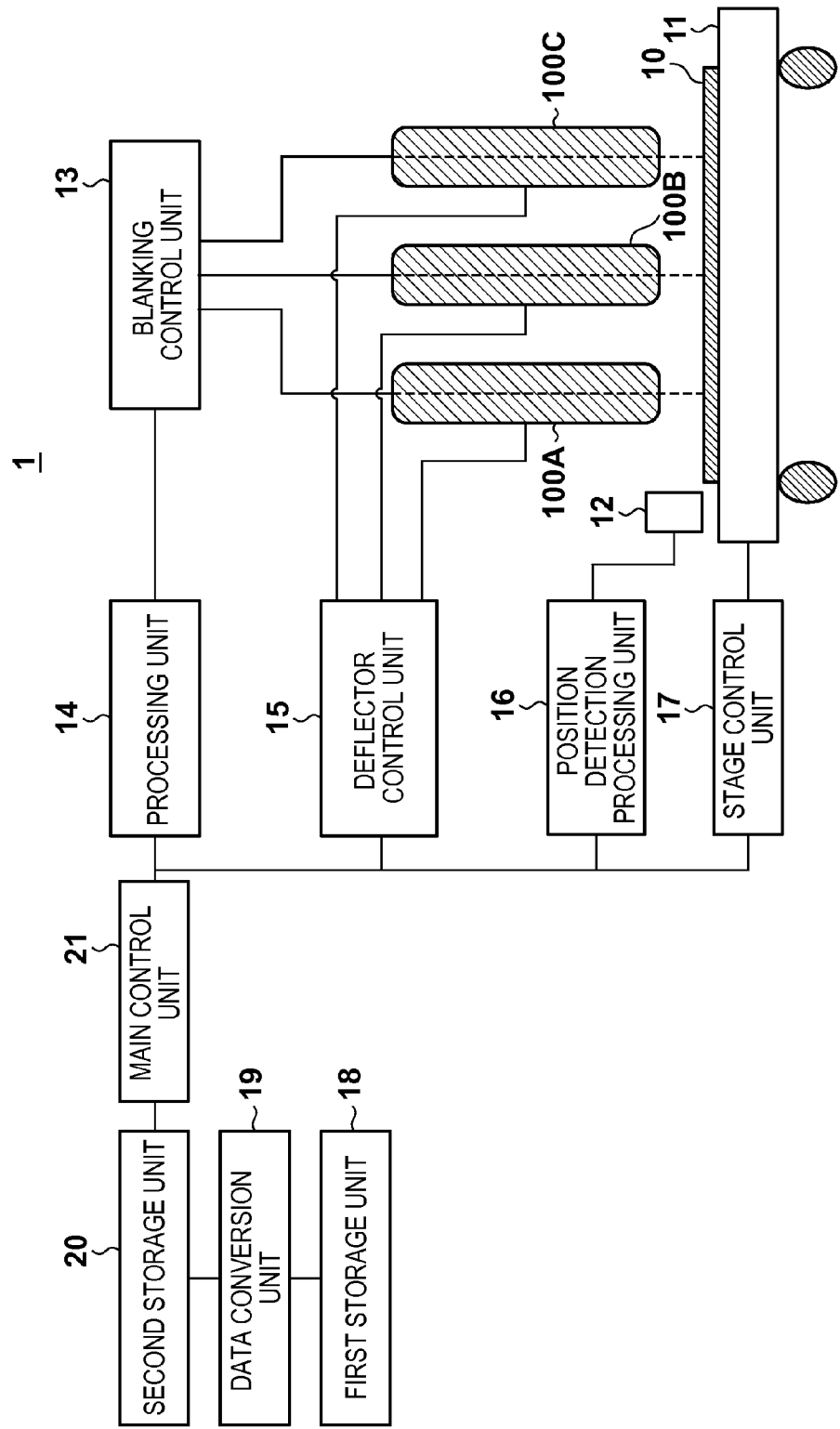
FIG. 1 is a schematic view showing the arrangement of a drawing apparatus according to an embodiment of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of a drawing apparatus 1 according to an embodiment of the present invention. The drawing apparatus 1 is a lithography apparatus for performing drawing on a substrate by a charged particle beam. In this embodiment, a pattern is drawn on a substrate using a plurality of charged particle beams emitted by each of a plurality of charged particle optical systems. The charged particle beam is not limited to an electron beam and may be, for example, an ion beam.

The drawing apparatus 1 includes a plurality of charged particle optical systems (in this embodiment, three charged particle optical systems, that is, a first charged particle optical system 100A, a second charged particle optical system 100B, and a third charged particle optical system 100C), a substrate stage 11, and a position detection system 12. The drawing apparatus 1 also includes a blanking control unit 13, a processing unit 14, a deflector control unit 15, a position detection processing unit 16, a stage control unit 17, a first storage unit 18, a data conversion unit 19, a second storage unit 20, and a main control unit 21.

Each of the first charged particle optical system 100A, the second charged particle optical system 100B, and the third charged particle optical system 100C emits a plurality of charged particle beams. Each of the first charged particle optical system 100A, the second charged particle optical system 100B, and the third charged particle optical system 100C has a function of blanking at least some of the plurality of charged particle beams. Each of the first charged particle optical system 100A, the second charged particle optical system 100B, and the third charged particle optical system 100C also has a function of deflecting the plurality of charged particle beams and displacing them on the substrate.

Figure 2:
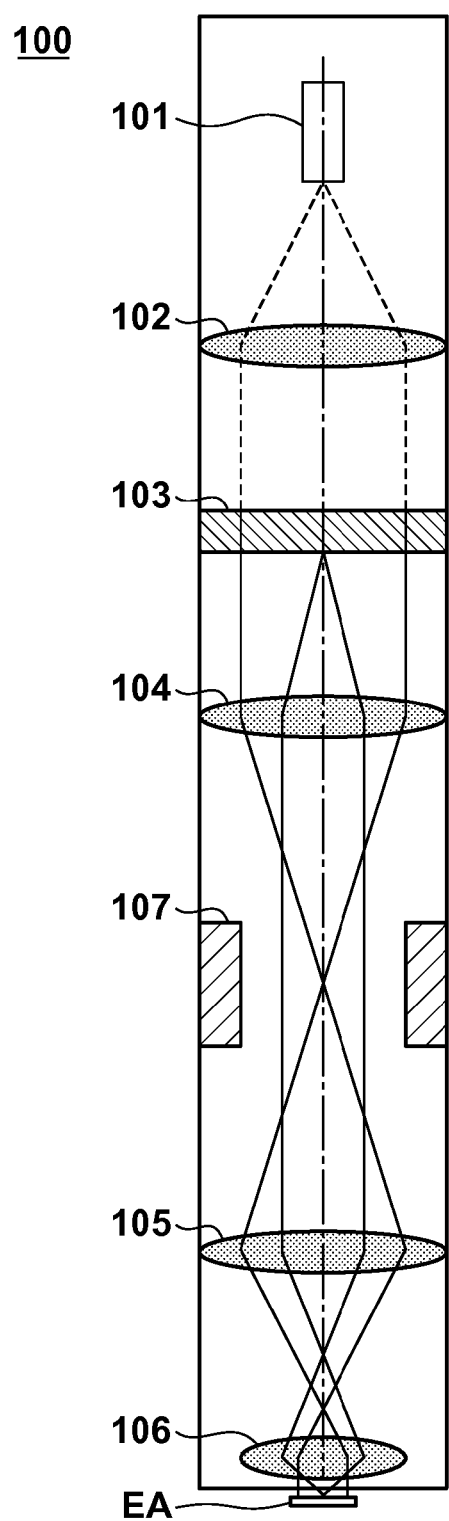
FIG. 2 is a schematic view showing the arrangement of a charged particle optical system of the drawing apparatus shown in FIG. 1.
Figure 5A:
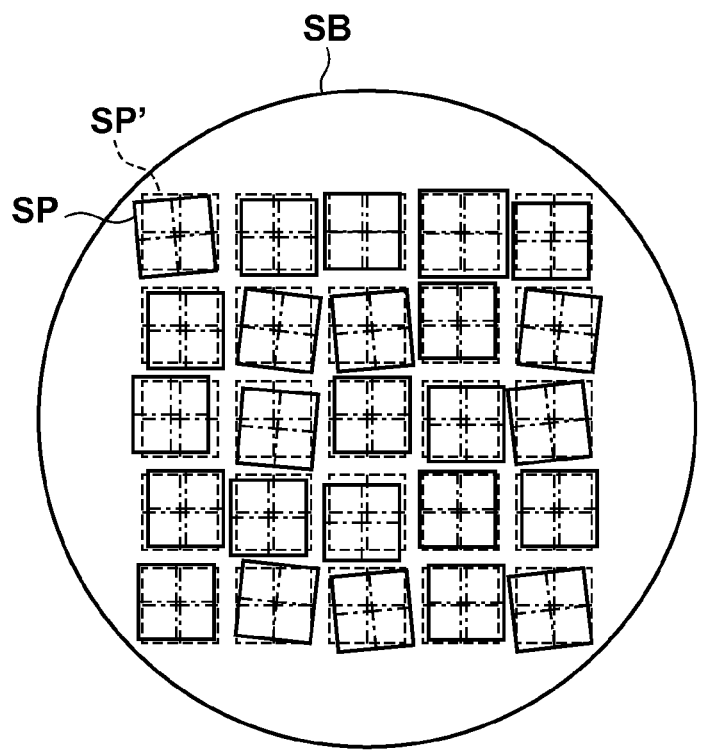
FIGS. 5A and 5B are views for explaining stripe drawing in overlay drawing.
Figure 5B:
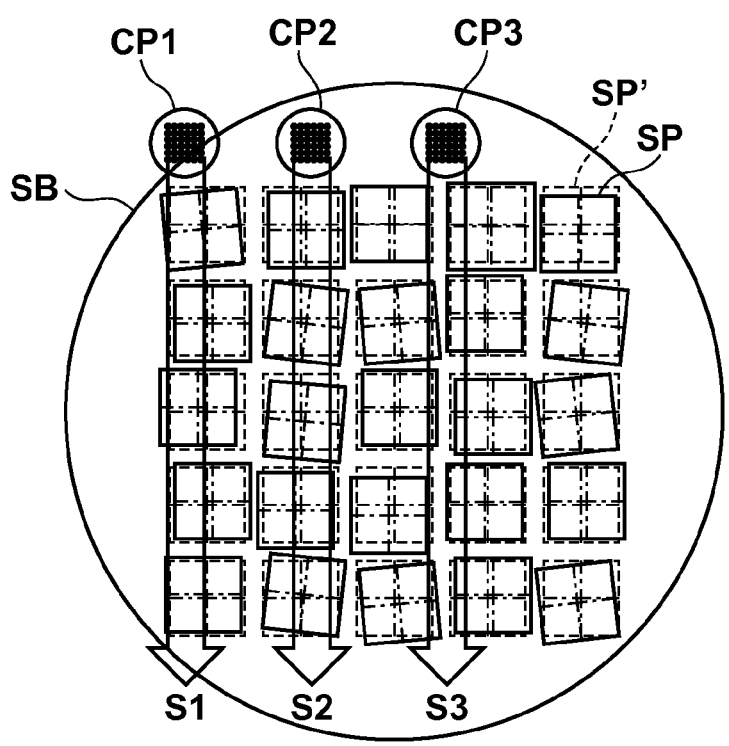

FIG. 2 is a schematic view showing the arrangement of a charged particle optical system 100 applicable as the first charged particle optical system 100A, the second charged particle optical system 100B, and the third charged particle optical system 100C. The charged particle optical system 100 includes a charged particle source 101, a collimator lens 102, a blanking aperture array 103, an electrostatic lens 104, a magnetic field lens 105, an objective lens 106, and a deflector 107.

The charged particle source 101 is a thermionic charged particle source including, for example, $LaB_6$ or BaO/W (dispenser cathode) as a charged particle beam emitting material. The collimator lens 102 is an electrostatic lens configured to converge a charged particle beam by an electric field. A charged particle beam emitted by the charged particle source 101 changes to an almost parallel charged particle beam via the collimator lens 102.

The blanking aperture array 103 divides the almost parallel charged particle beam from the collimator lens 102 into a plurality of charged particle beams by two-dimensionally arrayed apertures (not shown). The blanking aperture array 103 includes an electrostatic blanking deflector (not shown) capable of individually driving the plurality of charged particle beams, and switches irradiation and non-irradiation of each of the plurality of charged particle beams on the substrate. Note that blanking (non-irradiation) of a charged particle beam can be performed by an arrangement including a deflector, as described above, but may be done by another known arrangement.

The electrostatic lens 104 and the magnetic field lens 105 cooperatively form an intermediate image of the plurality of apertures of the blanking aperture array 103. The objective lens 106 is a magnetic field lens and projects the intermediate image of the plurality of apertures onto a substrate. The deflector 107 deflects the plurality of charged particle beams from the blanking aperture array 103 in a predetermined direction at once, and changes the position of a drawing region EA defined by the plurality of charged particle beams.

Referring back to FIG. 1, the substrate stage 11 holds a substrate 10 and moves. The substrate stage 11 includes, for example, an X-Y stage movable within an X-Y plane (horizontal plane) perpendicular to the optical axis of the charged particle optical system 100, and an electrostatic chuck configured to hold (attract) the substrate 10. In addition, a detector including an opening pattern where the charged particle beams enter and configured to detect the positions of the charged particle beams is arranged on the substrate stage 11.

The position detection system (detection unit) 12 includes an irradiation system configured to irradiate marks (for example, alignment marks) formed on the substrate 10 with light having a wavelength to which a resist (photoresist) is not sensitive, and an image sensor configured to capture an image of light specularly reflected by the marks, and detects the positions of the marks.

The blanking control unit 13 individually controls the blanking aperture arrays 103 of the first charged particle optical system 100A, the second charged particle optical system 100B, and the third charged particle optical system 100C. The processing unit 14 includes a buffer memory and a data processing circuit, and generates control data of the first charged particle optical system 100A, the second charged particle optical system 100B, and the third charged particle optical system 100C.

The deflector control unit 15 individually controls the deflectors 107 of the first charged particle optical system 100A, the second charged particle optical system 100B, and the third charged particle optical system 100C. The position detection processing unit 16 specifies (calculates) the actual coordinate values (positions) of shot patterns and distortions of the shot patterns based on the output (detection result) from the position detection system 12. The stage control unit 17 controls positioning of the substrate stage 11 in cooperation with laser interferometers (not shown) configured to measure the position of the substrate stage 11.

The first storage unit 18 is a memory configured to store design graphic data corresponding to a pattern to be drawn on the substrate 10. The data conversion unit 19 divides the design graphic data stored in the first storage unit 18 into stripes having a width set in the drawing apparatus 1, thereby converting the data into intermediate graphic data to facilitate drawing processing. The second storage unit 20 is a memory configured to store the intermediate graphic data.

The main control unit 21 includes a CPU and a memory and controls the whole (respective units) of the drawing apparatus 1. The main control unit 21 transfers the intermediate graphic data to (the buffer memory of) the processing unit 14 in accordance with the pattern to be drawn on the substrate 10, and generally controls the drawing apparatus 1 via the above-described respective units of the drawing apparatus 1. In this embodiment, the blanking control unit 13, the processing unit 14, the deflector control unit 15, the position detection processing unit 16, the stage control unit 17, the first storage unit 18, the data conversion unit 19, and the second storage unit 20 are individually constituted. However, the main control unit 21 may have those functions.

FIGS. 3A to 3C are views for explaining drawing processing of the drawing apparatus 1. FIG. 3A is a view showing an example of the array of a plurality of charged particle beams which are emitted by the charged particle optical system 100 and define the drawing region EA on the substrate. In this embodiment, the plurality of charged particle beams include 5 (rows)×20 (columns) charged particle beams. The row pitch is twice larger than the column pitch. As described above, the charged particle optical system 100 emits a plurality of charged particle beams arrayed in a first direction (column direction) and a second direction (row direction) perpendicular to the first direction. The moving direction of the substrate stage 11 is a direction from the upper side to the lower side of the drawing surface, as indicated by the arrow in FIG. 3A.

In this case, the main control unit 21 controls whether to irradiate the same position on the substrate with each of the plurality of charged particle beams that are arrayed in the column direction while continuously moving the substrate stage 11, thereby performing the drawing. In other words, the main control unit 21 controls the drawing so as to perform multiple irradiation of a target portion on the substrate with the plurality of charged particle beams. Assume a case in which drawing is performed on the substrate using the target charged particle beam array shown in FIG. 3A such that a relation shown in FIG. 3B holds between positions P1 to P6 on the substrate and the irradiating doses (exposure doses) of the charged particle beams at the positions P1 to P6 on the substrate. Assume that all charged particle beams irradiate the substrate by the same clock, the rows of the target charged particle beam array are represented by j, k, l, m, and n, and the substrate stage 11 is continuously moved in the column direction at such a speed that moves the substrate stage by the row pitch on a unit clock basis.

In this case, when on/off of each of the charged particle beams of the respective rows j to n of the target charged particle beam array (that is, whether to irradiate the substrate with the charged particle beams) is set (controlled) on a unit clock basis as shown in FIG. 3C, a relation as shown in FIG. 3B is obtained. Referring to FIG. 3C, dotted lines correspond to signals representing on (square) and off (no symbol) of the charged particle beams of the rows j to n, which irradiate the positions P1 to P6 on the substrate. This is because the substrate stage 11 moves by the pitch of the rows j to n of the target charged particle beam array in correspondence with two unit clocks. The relation shown in FIG. 3B is obtained by adding the irradiating doses of the charged particle beams of the rows j, k, l, m, and n shifted by two unit clocks. Since the charged particle beams arrayed in the column direction control the tones of irradiating doses, the relation is obtained only after all the charged particle beams arrayed in the column direction end the drawing.

A case will be explained with reference to FIGS. 4A to 4C in which the drawing apparatus 1 performs drawing sequentially on a first shot region SH1 and a second shot region SH2 on the substrate which are adjacent along the moving direction of the substrate stage 11. The substrate stage 11 is assumed to be moved continuously to the lower side of the drawing surface, as shown in FIG. 4A. The length of each of the first shot region SH1 and the second shot region SH2 in the moving direction of the substrate stage 11 is represented by S.

The left illustration of FIG. 4A indicates a case where overlay drawing is performed on (the first shot pattern formed in) the first shot region SH1 of the substrate. A drawing region EAs is defined by a plurality of charged particle beams CB when starting drawing on the first shot region SH1. The drawing region EAs is positioned by causing the deflector 107 to deflect the plurality of charged particle beams CB in the substrate stage moving direction and a direction perpendicular to it based on the actual position of the first shot region SH1 (first shot pattern). More specifically, the drawing region EAs is positioned such that out of the plurality of charged particle beams CB, charged particle beams (second charged particle beams) CB1 located at the opposite end of the moving direction of the substrate stage 11 are located at an end EP1 of the first shot region SH1. Note that the actual position of the first shot region SH1 can be specified based on a result of detecting an alignment mark formed on the first shot region SH1 by the position detection system 12. For the direction perpendicular to the moving direction of the substrate stage 11, the plurality of charged particle beams CB may be positioned (the position of the plurality of charged particle beams CB may be adjusted) by moving the substrate stage 11. Referring to FIG. 4A, a charged particle beam indicated by a full circle represents a charged particle beam capable of irradiating the substrate 10, and a charged particle beam indicated by an open circle represents a charged particle beam whose irradiation of the substrate 10 is stopped (inhibited).

A drawing region EAm is a drawing region during drawing on the first shot region SH1. All charged particle beams CB that define the drawing region EAm are located in the first shot region SH1. Irradiation with charged particle beams located in the second shot region SH2 out of the plurality of charged particle beams CB is stopped during drawing on the first shot region SH1 in accordance with movement of the substrate stage 11.

A drawing region EAe is defined by the plurality of charged particle beams CB when ending drawing on the first shot region SH1. Out of the plurality of charged particle beams CB, charged particle beams (first charged particle beams) CB2 located at the front end of the moving direction of the substrate stage 11 are located at an end EP2 of the first shot region SR1 on the side of the second shot region SH2. In addition, out of the plurality of charged particle beams CB, charged particle beams other than the charged particle beams CB2 are located in the second shot region SH2.

The right illustration of FIG. 4A indicates a case where overlay drawing is performed on (the first shot pattern formed in) the second shot region SH2 of the substrate. The substrate stage 11 continuously moves even during the time after the charged particle beams CB2 have reached the end EP2 of the first shot region SH1 until drawing on the second shot region SH2 starts. Hence, as shown in the right illustration of FIG. 4A, a drawing region EAs' needs to be positioned such that the charged particle beams CB1 are located at an end EP3 of the second shot region SH2 on the side of the first shot region SH1 when starting the drawing on the second shot region SH2. At this time, in this embodiment, the plurality of charged particle beams CB are deflected in the moving direction of the substrate stage 11 by the deflector 107, instead of moving the substrate stage 11 in the opposite direction. For example, when starting drawing on the second shot region SH2, the deflector 107 deflects the plurality of charged particle beams CB in the moving direction of the substrate stage 11 by the length (a length B shown in FIG. 4A) of the drawing region EA in the moving direction of the substrate stage 11. This can locate the charged particle beams CB1 at the end EP3 of the second shot region SH2 on the side of the first shot region SH1. In addition, the drawing region is positioned by causing the deflector 107 to deflect the plurality of charged particle beams CB in the moving direction of the substrate stage 11 and the direction perpendicular to it based on the actual position of the second shot region SH2 (second shot pattern). Note that the actual position of the second shot region SH2 can be specified based on a result of detecting an alignment mark formed on the second shot region SH2 by the position detection system 12. For the direction perpendicular to the moving direction of the substrate stage 11, the plurality of charged particle beams CB may be positioned (the position of the plurality of charged particle beams CB may be adjusted) by moving the substrate stage 11.

In FIG. 4B, the solid line indicates the position of the charged particle beams CB1 on the substrate when sequentially performing drawing on the first shot region SH1 and the second shot region SH2 of the substrate. FIG. 4B employs the position on the substrate along the ordinate and the time along the abscissa. In FIG. 4B, the dotted line indicates the reference position of the charged particle optical system 100 with respect to the continuously moving substrate stage 11. When the deflection amount of the charged particle beams CB by the deflector 107 is set as shown in FIG. 4C, that is, so as to change in a serrated pattern, the locus of the charged particle beams CB1 as indicated by the solid line in FIG. 4B can be obtained.

As shown in FIG. 4A, out of the plurality of charged particle beams CB, charged particle beams located in the second shot region SH2 as the substrate stage 11 moves during drawing on the first shot region SH1 are blanked. The drawing is controlled such that after the end of the drawing on the first shot region SH1 by the plurality of charged particle beams, the plurality of charged particle beams in the moving direction of the substrate stage 11 are deflected, and drawing on the second shot region SH2 is then started.

In this embodiment, while the substrate stage moves by a length S of a shot region in the moving direction of the substrate stage, the deflector 107 deflects the plurality of charged particle beams in the moving direction of the substrate stage to change the position of the drawing region. At this time, the plurality of charged particle beams are deflected additionally by the length B of the drawing region in the moving direction of the substrate stage. In other words, the plurality of charged particle beams are displaced in the moving direction of the substrate stage 11 during the time from the end of drawing on the first shot region SH1 to the start of drawing on the second shot region SH2. Note that the plurality of charged particle beams are displaced by a displacement amount based on the length of the plurality of charged particle beams in the moving direction of the substrate stage 11. At this time, the plurality of charged particle beams may be displaced by a displacement amount based on the position of the second shot region SH2 on the substrate as well.

As described above, the drawing apparatus 1 can perform drawing sequentially on the shot regions of the substrate adjacent along the moving direction of the substrate stage 11 while continuously moving the substrate stage 11 in one direction (that is, without discontinuously moving the stage). The drawing apparatus 1 can thus maintain a high precision of relative alignment between the charged particle beams and the substrate 10 without lowering the throughput and the reproducibility of position control of the substrate stage 11.

In this embodiment, a description has been made using drawing on one shot region on a substrate as a unit. However, the unit of drawing of the drawing apparatus 1 is not limited to a shot region. For example, a chip region on a substrate may be used as a drawing unit.

The drawing apparatus 1 is advantageous in performing overlay drawing on a substrate using a plurality of charged particle beams, and is therefore suitable for manufacturing an article, for example, a micro device such as a semiconductor device or an element having a fine structure. The method of manufacturing an article includes a step of forming a latent image pattern on a substrate with a photoresist applied on it using the drawing apparatus 1 (a step of performing drawing on a substrate), and a step of developing the substrate on which the latent image pattern is formed in the above step (a step of developing the substrate on which the drawing has been performed). The manufacturing method can also include other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2013-095960 filed on Apr. 30, 2013, which is hereby incorporated by reference herein in its entirety.

What is claimed is:

1. A drawing apparatus for performing drawing on a substrate with a charged particle beam, the apparatus comprising:

a substrate stage configured to hold the substrate and be moved;

a charged particle optical system having a function of irradiating a plurality of charged particle beams arrayed along a first axis, of individually blanking the plurality of charged particle beams, and of deflecting at least a portion of the plurality of charged particle beams to perform displacement of the at least a portion of the plurality of charged particle beams on the substrate; and a controller configured to control the drawing so as to perform multiple irradiation of a target portion on the substrate with at least a portion of the plurality of charged particle beams, wherein the controller is configured to control the drawing such that the substrate stage is moved in one direction along the first axis with respect to a plurality of shot regions formed on the substrate along the first axis, and the deflection for the displacement along the first axis is performed with drawing on each of the plurality of shot regions as a unit, and wherein the controller is configured to control the drawing such that, during drawing on a first shot region of the plurality of shot regions with at least a portion of the plurality of charged particle beams, charged particle beams, of the plurality of charged particle beams, located in a second shot region, of the plurality of shot regions, as the substrate stage is moved, are blanked, and after the drawing on the first shot region with the at least a portion of the plurality of charged particle beams is ended, the deflection for the displacement along the first axis is performed, and then drawing on the second shot region with at least a portion of the plurality of charged particle beams is started.

2. The apparatus according to claim 1, wherein the controller is configured to control the drawing such that at least a portion of the plurality of charged particle beams are displaced on the substrate in a moving direction of the substrate stage, by a displacement amount based on a length of the plurality of charged particle beams along the first axis, in a time from an end of the drawing on the first shot region to a start of the drawing on the second shot region.

3. The apparatus according to claim 2, wherein the controller is configured to control the drawing such that the plurality of charged particle beams are displaced by the displacement amount further based on a position of the second shot region on the substrate.

4. The apparatus according to claim 1, wherein the controller is configured to control the drawing such that the at least a portion of the plurality of charged particle beams are displaced on the substrate along a second axis orthogonal to the first axis based on a position of the second shot region on the substrate in a time from an end of the drawing on the first shot region to a start of the drawing on the second shot region.

5. The apparatus according to claim 4, wherein the controller is configured to control the drawing such that the at least a portion of the plurality of charged particle beams are displaced on the substrate along the second axis by at least one of displacement of the substrate stage and the function of deflecting.

6. The apparatus according to claim 1, further comprising a detector configured to detect a mark formed on the substrate to obtain a position of each of the plurality of shot regions.

7. The apparatus according to claim 1, wherein the controller is configured to control the drawing such that an amount of the deflection for the displacement along the first axis changes with time in a sawtooth pattern with drawing on each of the plurality of shot regions as unit.

* * * * *